(12) United States Patent
Kannan et al.

(10) Patent No.: US 9,747,158 B1
(45) Date of Patent: Aug. 29, 2017

(54) INTELLIGENT REFRESH OF 3D NAND

(71) Applicant: Pure Storage, Inc., Moutain View, CA (US)

(72) Inventors: Hari Kannan, Sunnyvale, CA (US); Robert Lee, San Carlos, CA (US); Yuhong Mao, Fremont, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 15/406,484

(22) Filed: Jan. 13, 2017

(51) Int. Cl.
| | |
|---|---|
| G11C 29/00 | (2006.01) |
| G06F 11/10 | (2006.01) |
| G11C 16/34 | (2006.01) |
| G11C 11/402 | (2006.01) |
| G01R 31/317 | (2006.01) |
| G06F 11/07 | (2006.01) |
| H04L 1/20 | (2006.01) |

(52) U.S. Cl.
CPC ........ G06F 11/102 (2013.01); G01R 31/3171 (2013.01); G06F 11/076 (2013.01); G11C 11/402 (2013.01); G11C 16/3427 (2013.01); H04L 1/20 (2013.01)

(58) Field of Classification Search
CPC .. G06F 11/102; G11C 16/3227; G11C 11/402
See application file for complete search history.

(56) References Cited

U.S. PATENT DOCUMENTS

| | | | |
|---|---|---|---|
| 6,725,392 B1 | 4/2004 | Frey et al. | |
| 6,845,045 B1 * | 1/2005 | Cernea | G11C 8/08 365/185.11 |
| 6,952,794 B2 | 10/2005 | Lu | |
| 6,961,890 B2 | 11/2005 | Smith | |
| 7,151,694 B2 | 12/2006 | Meihong et al. | |
| 7,167,878 B2 * | 1/2007 | Chan | G06F 17/30371 |
| 7,266,747 B2 * | 9/2007 | Foss | G06F 11/1044 714/755 |
| 7,472,331 B2 | 12/2008 | Kim | |
| 7,509,645 B2 | 3/2009 | Coates et al. | |
| 7,640,452 B2 | 12/2009 | Chen et al. | |
| 7,778,960 B1 | 8/2010 | Chatterjee et al. | |
| 7,869,383 B2 | 1/2011 | Tabbara et al. | |

(Continued)

OTHER PUBLICATIONS

Savill, John; Introduction to CLuster Shared Volumes, Aug. 14, 2011. http://windowsitpro.com/high-availability/introduction-cluster-shared-volumes.

(Continued)

*Primary Examiner* — Esaw Abraham

(74) *Attorney, Agent, or Firm* — Womble Carlyle Sandridge & Rice LLP

(57) ABSTRACT

A method for processing blocks of flash memory to decrease raw bit errors from the flash memory is provided. The method includes identifying one or more blocks of the flash memory for a refresh operation and writing information regarding the identified blocks, to a data structure. The method includes issuing background reads to the identified blocks, according to the data structure, as the refresh operation. The method may be embodied on a computer readable medium. In some embodiments the background reads may be based on a time based refresh responsive to an increase in raw bit error count in the flash memory over time.

11 Claims, 10 Drawing Sheets

(56) References Cited

U.S. PATENT DOCUMENTS

| | | | |
|---|---|---|---|
| 7,908,448 B1 | 3/2011 | Chatterjee et al. | |
| 8,010,485 B1 | 8/2011 | Chatterjee et al. | |
| 8,010,829 B1 | 8/2011 | Chatterjee et al. | |
| 8,046,548 B1 | 10/2011 | Chatterjee et al. | |
| 8,051,361 B2 | 11/2011 | Sim-Tang et al. | |
| 8,065,573 B2 | 11/2011 | Abts et al. | |
| 8,081,512 B2 | 12/2011 | Ueno et al. | |
| 8,086,911 B1 | 12/2011 | Taylor | |
| 8,103,904 B2 | 1/2012 | Hafner et al. | |
| 8,145,838 B1 | 3/2012 | Miller et al. | |
| 8,156,392 B2 | 4/2012 | Flynn et al. | |
| 8,195,688 B1 | 6/2012 | Sawhney et al. | |
| 8,244,999 B1 | 8/2012 | Chatterjee et al. | |
| 8,281,023 B2 | 10/2012 | Dondeti et al. | |
| 8,296,625 B2 | 10/2012 | Diggs et al. | |
| 8,327,080 B1 | 12/2012 | Der | |
| 8,429,492 B2 | 4/2013 | Yoon et al. | |
| 8,458,287 B2 | 6/2013 | Ozzie et al. | |
| 8,473,778 B2 | 6/2013 | Simitci et al. | |
| 8,479,037 B1 | 7/2013 | Chatterjee et al. | |
| 8,498,967 B1 | 7/2013 | Chatterjee et al. | |
| 8,520,461 B2 * | 8/2013 | Lee | G11C 11/406 365/222 |
| 8,522,073 B2 | 8/2013 | Cohen | |
| 8,560,922 B2 | 10/2013 | Bivens et al. | |
| 8,589,761 B2 | 11/2013 | Cronin et al. | |
| 8,595,455 B2 | 11/2013 | Chatterjee et al. | |
| 8,621,291 B2 | 12/2013 | Kinoshita | |
| 8,627,136 B2 | 1/2014 | Shankar et al. | |
| 8,683,277 B1 | 3/2014 | Varnica et al. | |
| 8,700,875 B1 | 4/2014 | Barron et al. | |
| 8,706,962 B2 | 4/2014 | Belluomini et al. | |
| 8,760,922 B2 | 6/2014 | Lassa | |
| 8,775,868 B2 | 7/2014 | Colgrove et al. | |
| 8,775,901 B2 | 7/2014 | Sharon et al. | |
| 8,799,746 B2 | 8/2014 | Baker et al. | |
| 8,843,447 B2 | 9/2014 | Molaro et al. | |
| 8,850,108 B1 | 9/2014 | Hayes et al. | |
| 8,856,431 B2 | 10/2014 | Chen | |
| 8,856,593 B2 | 10/2014 | Eckhardt et al. | |
| 8,892,980 B2 | 11/2014 | Fillingim | |
| 8,904,123 B2 | 12/2014 | Crawford et al. | |
| 8,959,416 B1 | 2/2015 | Malonzo | |
| 8,977,803 B2 | 3/2015 | Horn et al. | |
| 9,009,565 B1 | 4/2015 | Northcott et al. | |
| 9,025,405 B2 * | 5/2015 | Jeong | G11C 11/402 365/149 |
| 9,122,699 B2 | 9/2015 | Molaro et al. | |
| 9,214,351 B2 * | 12/2015 | Hsiao | H01L 21/28282 |
| 9,220,461 B2 * | 12/2015 | Samuelsson | A61B 5/6852 |
| 9,299,455 B2 | 3/2016 | Suzuki et al. | |
| 9,406,390 B2 * | 8/2016 | Kim | G11C 16/28 |
| 9,478,315 B2 * | 10/2016 | Yang | G11C 29/44 |
| 2002/0172074 A1 | 11/2002 | Hsu et al. | |
| 2006/0236056 A1 | 10/2006 | Nagata | |
| 2007/0268905 A1 | 11/2007 | Baker et al. | |
| 2008/0117548 A1 | 5/2008 | Azuma et al. | |
| 2008/0295118 A1 | 11/2008 | Liao | |
| 2010/0251077 A1 | 9/2010 | Kim et al. | |
| 2010/0268908 A1 | 10/2010 | Ouyang et al. | |
| 2010/0287335 A1 | 11/2010 | Chung et al. | |
| 2011/0113075 A1 | 5/2011 | Fukushima | |
| 2011/0307758 A1 | 12/2011 | Fillingim | |
| 2012/0066473 A1 | 3/2012 | Tremaine et al. | |
| 2012/0166749 A1 | 6/2012 | Eleftheriou et al. | |
| 2012/0239853 A1 | 9/2012 | Moshayedi | |
| 2012/0239990 A1 | 9/2012 | Mataya et al. | |
| 2012/0272036 A1 | 10/2012 | Muralimanohar et al. | |
| 2012/0278511 A1 | 11/2012 | Alatorre et al. | |
| 2012/0311557 A1 | 12/2012 | Resch | |
| 2013/0046920 A1 | 2/2013 | Ryu et al. | |
| 2013/0060884 A1 | 3/2013 | Bernbo et al. | |
| 2013/0117636 A1 | 5/2013 | Kim et al. | |
| 2013/0132638 A1 | 5/2013 | Horn et al. | |
| 2013/0173844 A1 | 7/2013 | Chen et al. | |
| 2013/0198445 A1 | 8/2013 | Bando et al. | |
| 2013/0205183 A1 | 8/2013 | Fillingim | |
| 2013/0232289 A1 | 9/2013 | Zhong et al. | |
| 2013/0238836 A1 | 9/2013 | Suzuki et al. | |
| 2014/0006733 A1 | 1/2014 | Seo et al. | |
| 2014/0047263 A1 | 2/2014 | Coatney et al. | |
| 2014/0092683 A1 | 4/2014 | Hyun et al. | |
| 2014/0136880 A1 | 5/2014 | Shankar et al. | |
| 2014/0136927 A1 | 5/2014 | Li et al. | |
| 2014/0189421 A1 | 7/2014 | Werner et al. | |
| 2014/0195558 A1 | 7/2014 | Murthy et al. | |
| 2015/0052416 A1 | 2/2015 | Prohofsky et al. | |

OTHER PUBLICATIONS

Xiao Qin et al.; "Measuring and Analyzing Write Amplification Characteristics of Solid State Disks"; Modeling, Analysis & Simulation of Computer and Telecommunication Systems (MASCOTS), 2013 IEEE 21st International Symposium on Aug. 2013. (http://www.researchgate.net/publication/262362154). See pp. 1-10.

Storer, Mark W., Greenan, Kevin M., Miller L. Ethan, Voruganti, Kaladhar; Pergamum: Replacing Tape with Energy Efficient, Reliable, Disk-Based Archival Storage;.

Hwang, Kai, Jin, Hair, Ho, Roy; RAID-x: a New Distributed Disk Array for I/O-Centric Cluster Computing.

* cited by examiner

NAND FLASH

3D NAND FLASH

US 9,747,158 B1

INTELLIGENT REFRESH OF 3D NAND

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media. Yet, many solid-state drives are designed to conform to hard disk drive standards for compatibility reasons, which makes it difficult to provide enhanced features or take advantage of unique aspects of flash and other solid-state memory. A newer type of flash memory, three dimensional (3D) NAND, has error behaviors that change over time but are not mitigated in hard disk drive or solid-state drive architectures. These error behaviors can result in inconsistent and error-prone reading of data, and early retirement of flash memory in the mistaken belief that the flash memory has degraded.

It is within this context that the embodiments arise.

SUMMARY

In some embodiments, a method for processing blocks of flash memory to decrease raw bit errors from the flash memory is provided. The method includes identifying one or more blocks of the flash memory for a refresh operation and writing information regarding the identified blocks, to a data structure. The method includes issuing background reads to the identified blocks, according to the data structure, as the refresh operation. The method may be embodied on a computer readable medium. In some embodiments the background reads may be based on a time based refresh responsive to an increase in raw bit error count in the flash memory over time.

In some embodiments, a storage system is provided. The storage system includes a flash memory and further memory, configurable to hold a data structure. The system includes one or more processors, configurable to identify blocks of the flash memory for a refresh operation and the one or more processors configurable to write information regarding the identified blocks to the data structure. The system includes a hardware engine, configurable to sequence background reads of the identified blocks according to the data structure as the refresh operation.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
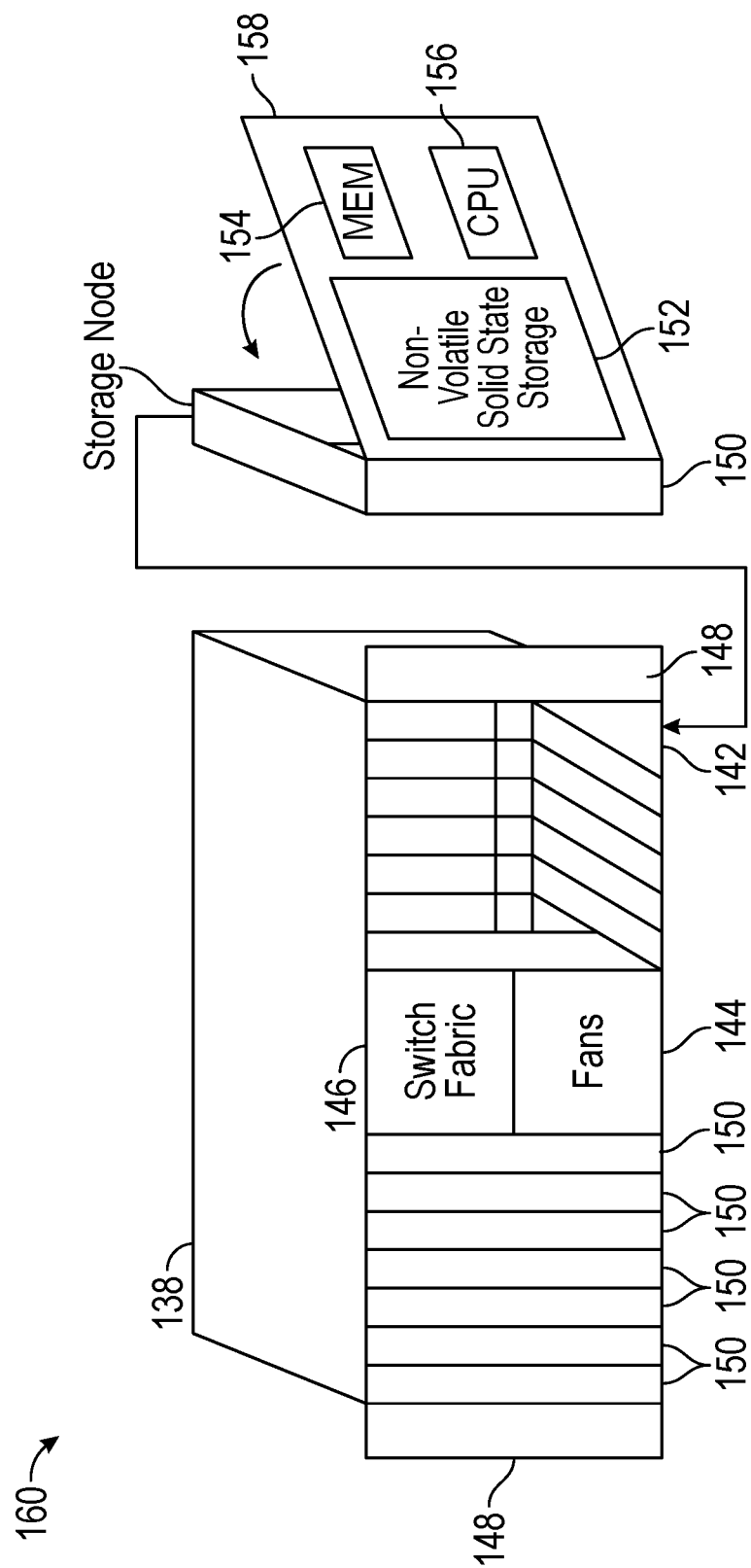
FIG. 1 is a perspective view of a storage cluster with multiple storage nodes and internal storage coupled to each storage node to provide network attached storage, in accordance with some embodiments.

Embodiments of a storage system described herein solve a problem with charge buildup and associated increases in errors on three dimensional (3D) NAND flash memory. A sequencer cycles through background read operations of blocks of flash memory, discharging the charge buildup and thus refreshing the 3D NAND flash for reads with lower raw error rates than if the charge buildup is left present. Various features for the intelligent refresh of 3D NAND can be implemented in storage clusters (e.g., with multiple storage nodes), storage arrays (e.g., with a central controller or high-availability controller pair), solid-state drives, solid-state storages, or other storage systems. It is possible other types of solid-state memory could benefit, too.

The embodiments below describe a storage cluster that stores user data, such as user data originating from one or more user or client systems or other sources external to the storage cluster. The storage cluster distributes user data across storage nodes housed within one or more chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server. Various system aspects are discussed below with reference to FIGS. 1-5. Intelligent refresh of 3D NAND is described with reference to FIGS. 6-10.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 1, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2:
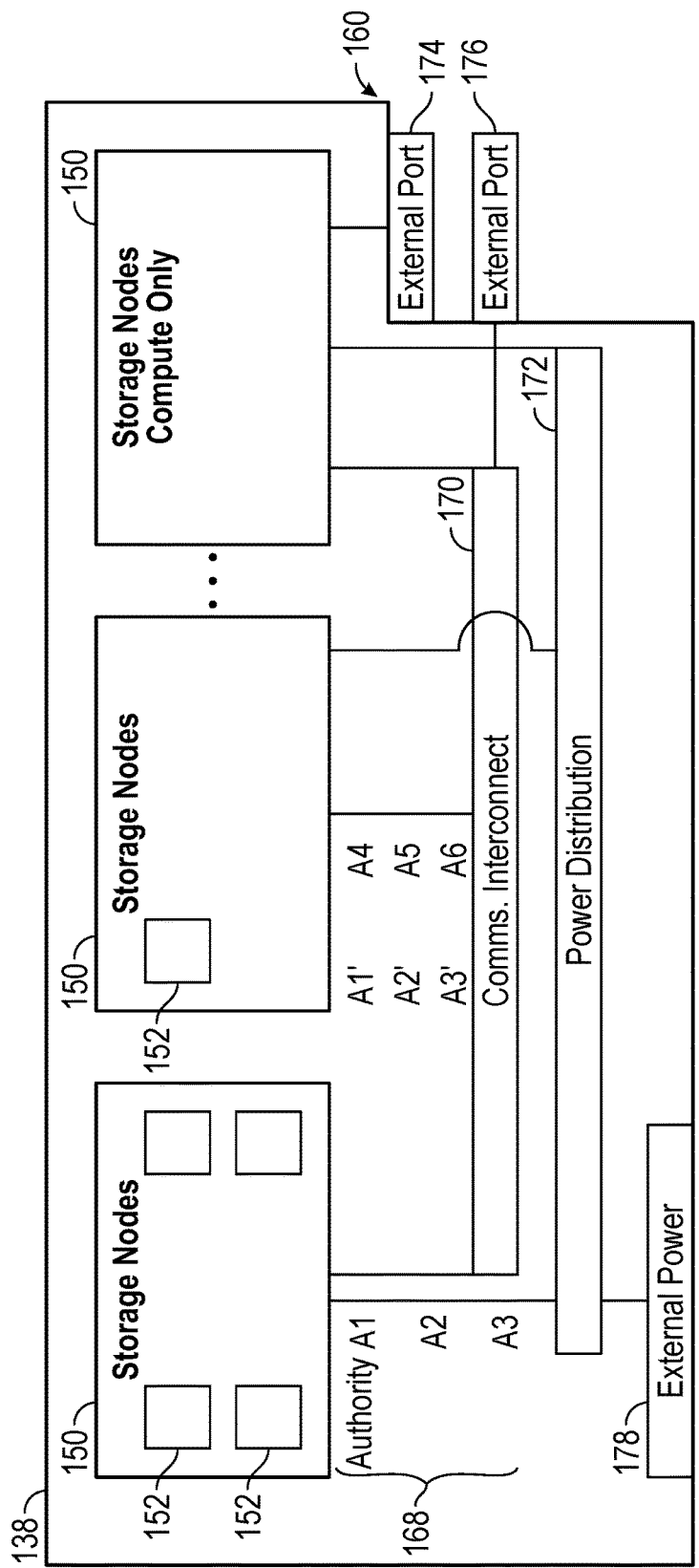
FIG. 2 is a block diagram showing an interconnect switch coupling multiple storage nodes in accordance with some embodiments.

FIG. 2 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 2, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 1. In addition, one or more storage nodes 150 may be a compute only storage node as illustrated in FIG. 2. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of Mode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an Mode number or a data segment number. The output of this operation points to a non-volatile solid state storage 152 having the authority 168 for that particular piece of data. In some embodiments there are two stages to this operation. The first stage maps an entity identifier (ID), e.g., a segment number, Mode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1 and 2, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or Mode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain metadata, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Modes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 3:
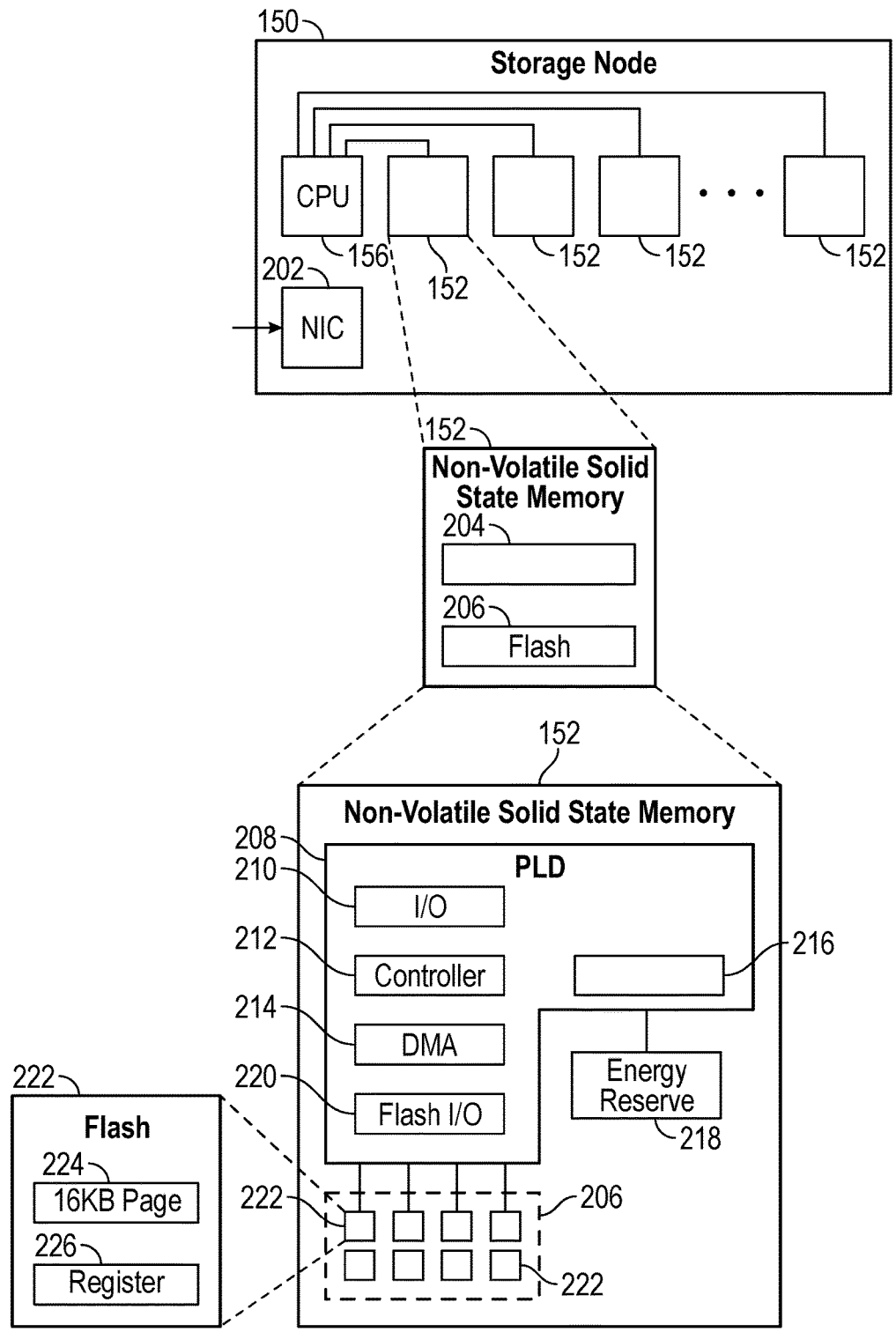
FIG. 3 is a multiple level block diagram, showing contents of a storage node and contents of one of the non-volatile solid state storage units in accordance with some embodiments.

FIG. 3 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 3, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 160, in various embodiments as disclosed herein, can be contrasted with storage arrays in general. The storage nodes 150 are part of a collection that creates the storage cluster 160. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 160, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 4:
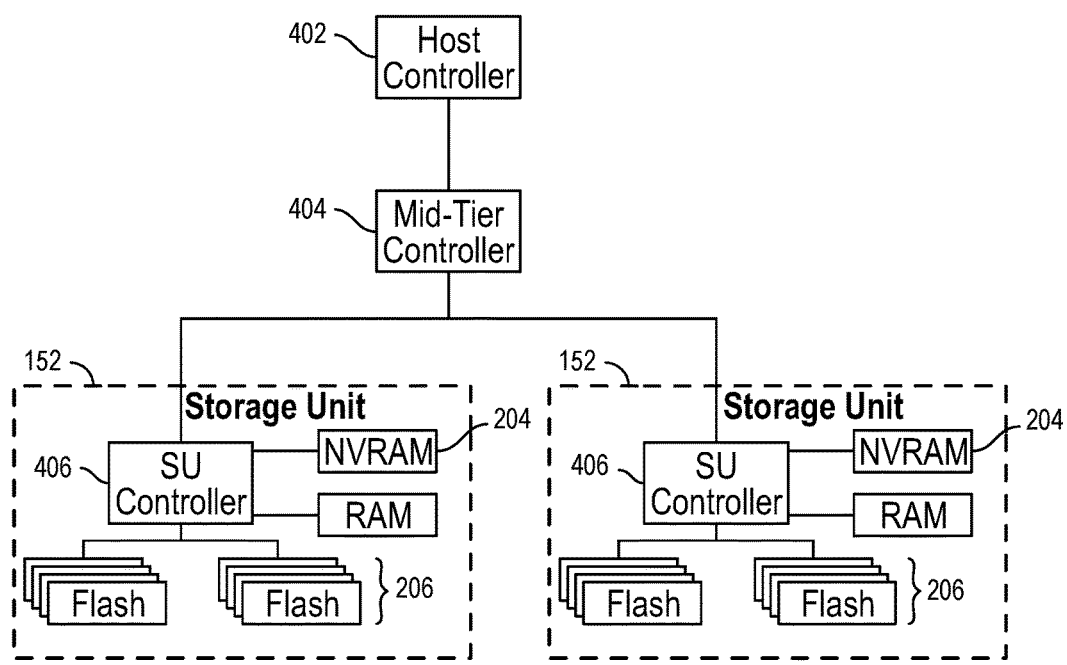
FIG. 4 shows a storage server environment, which uses embodiments of the storage nodes and storage units of FIGS. 1-3 in accordance with some embodiments.

FIG. 4 shows a storage server environment, which uses embodiments of the storage nodes 150 and storage units 152 of FIGS. 1-3. In this version, each storage unit 152 has a processor such as controller 212 (see FIG. 3), an FPGA (field programmable gate array), flash memory 206, and NVRAM 204 (which is super-capacitor backed DRAM 216, see FIGS. 2 and 3) on a PCIe (peripheral component interconnect express) board in a chassis 138 (see FIG. 1). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 512 independently. Each device provides an amount of storage space to each authority 512. That authority 512 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 512. This distribution of logical control is shown in FIG. 4 as a host controller 402, mid-tier controller 404 and storage unit controller(s) 406. Management of the control plane and the storage plane are treated independently, although parts may be physically co-located on the same blade. Each authority 512 effectively serves as an independent controller. Each authority 512 provides its own data and metadata structures, its own background workers, and maintains its own lifecycle.

Figure 5:
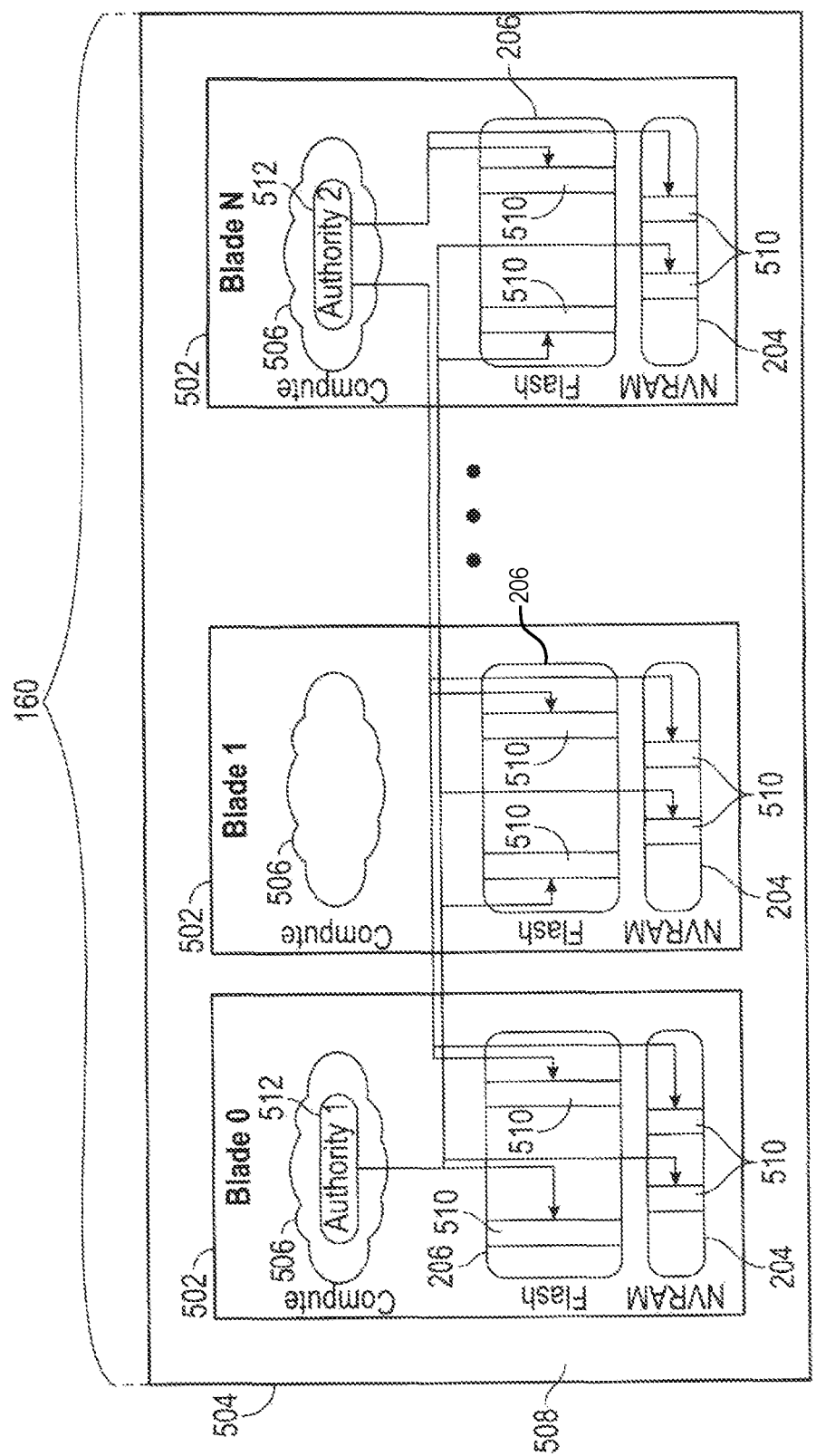
FIG. 5 is a blade hardware block diagram, showing a control plane, compute and storage planes, and authorities interacting with underlying physical resources, in accordance with some embodiments.

FIG. 5 is a blade 502 hardware block diagram, showing a control plane 504, compute and storage planes 506, 508, and authorities 512 interacting with underlying physical resources, using embodiments of the storage nodes 150 and storage units 152 of FIGS. 1-3 in the storage server environment of FIG. 4. The control plane 504 is partitioned into a number of authorities 512 which can use the compute resources in the compute plane 506 to run on any of the blades 502. The storage plane 508 is partitioned into a set of devices, each of which provides access to flash 206 and NVRAM 204 resources.

In the compute and storage planes 506, 508 of FIG. 5, the authorities 512 interact with the underlying physical resources (i.e., devices). From the point of view of an authority 512, its resources are striped over all of the physical devices. From the point of view of a device, it provides resources to all authorities 512, irrespective of where the authorities happen to run. Each authority 512 has allocated or has been allocated one or more partitions 510 of storage memory in the storage units 152, e.g. partitions 510 in flash memory 206 and NVRAM 204. Each authority 512 uses those allocated partitions 510 that belong to it, for writing or reading user data. Authorities can be associated with differing amounts of physical storage of the system. For example, one authority 512 could have a larger number of partitions 510 or larger sized partitions 510 in one or more storage units 152 than one or more other authorities 512.

Figure 6:
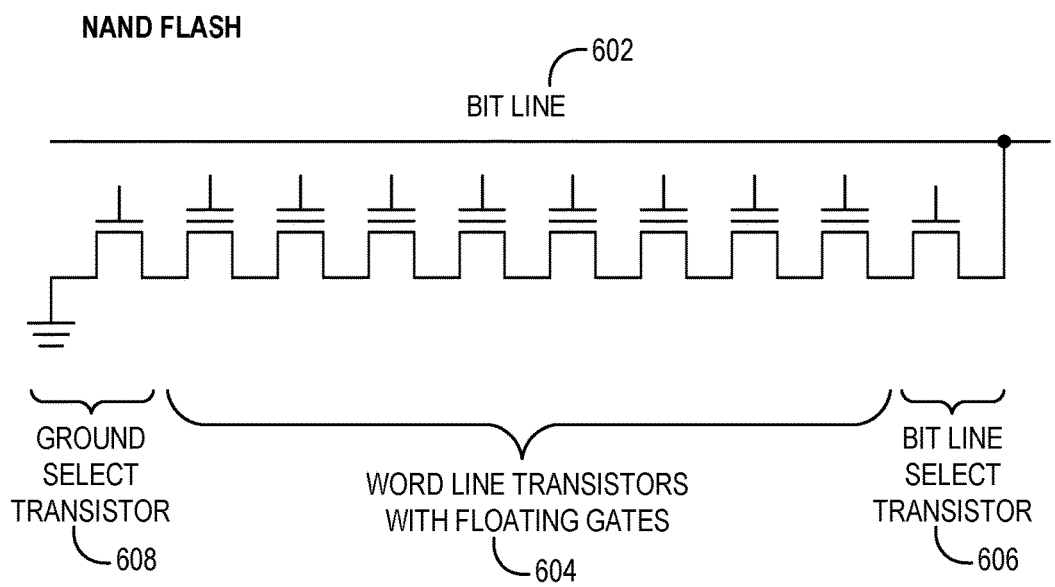
FIG. 6 shows an example bit line and series transistor circuit, as commonly seen in NAND flash memory.

FIG. 6 shows an example bit line 602 and series transistor circuit, as commonly seen in NAND flash memory. By contrast, NOR flash memory has the floating gate transistors in parallel, and NAND flash memory has the floating gate transistors in series. Reading the NAND series circuit involves raising one of the word lines to above the threshold of an erased floating gate transistor, and the other word lines to above the threshold of a programmed floating gate transistor. If the selected floating gate transistor is programmed, that transistor does not turn on, and the bit line does not get discharged through the series circuit. If the selected floating gate transistor is not programmed, that transistor does turn on, and the bit line does get discharged through the series circuit.

Figure 7:
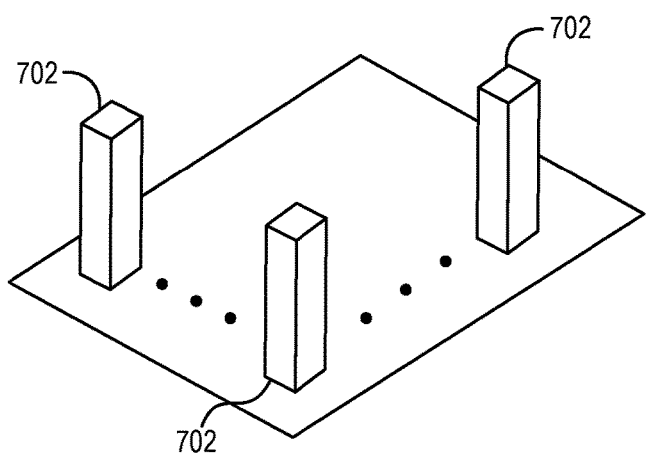
FIG. 7 depicts 3D NAND flash, which can build up static electric charges over time.

FIG. 7 depicts 3D NAND flash, which can build up static electric charges over time. In this type of flash memory, the series transistor circuit depicted in FIG. 6 is constructed in a column 702, several of which are shown as examples in FIG. 7. It should be appreciated that the drawing is not to scale, and actual 3D flash memory is much denser. Static electric charges could build up in various locations in the 3D NAND flash, disrupting read operations and resulting in increased errors. Built up static electric charge produces an electric field, which affects the thresholds of programmed and unprogrammed floating gate transistors.

Figure 8:
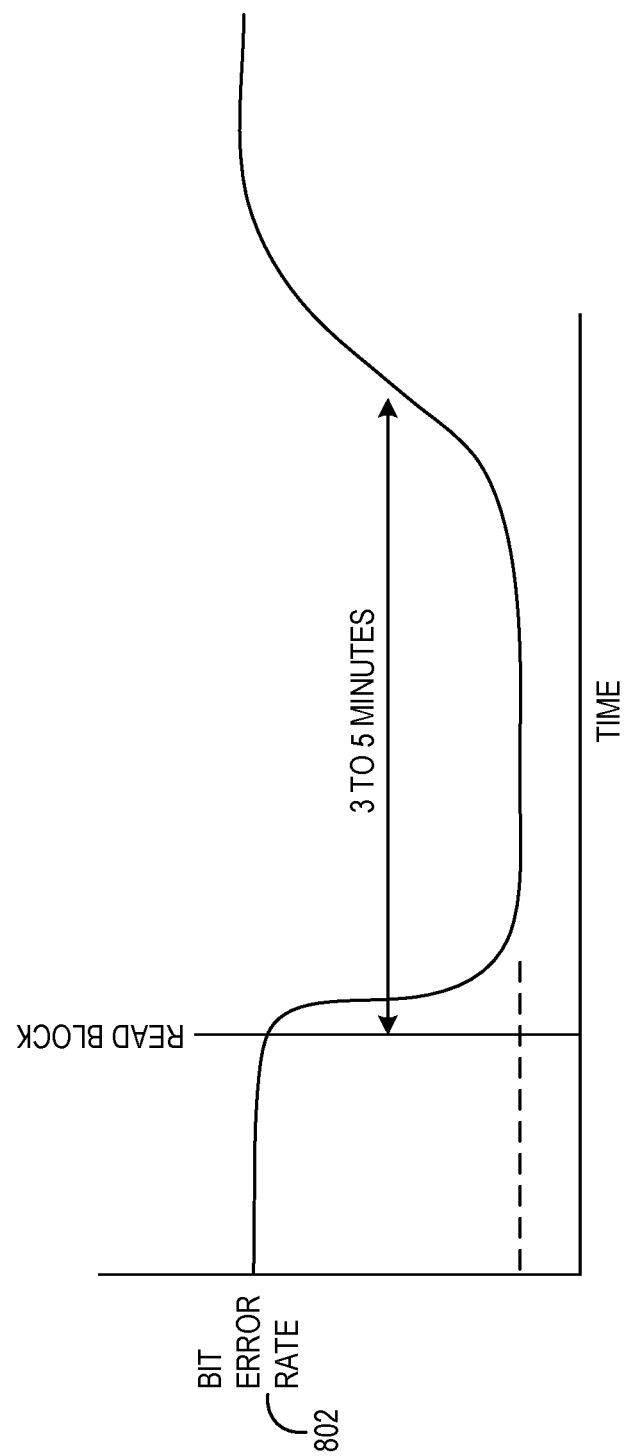
FIG. 8 is a graph of bit error rate versus time, for a 3D NAND flash memory.

FIG. 8 is a graph of bit error 802 rate versus time, for a 3D NAND flash memory. Reading a block of flash memory discharges the built up static electric charge and brings the bit error rate 802 back down to preferred levels, from the elevated level seen while the static electric charge is present. In some embodiments, the bit error rate is minimized by reading every block in every flash memory die in the entire storage system, every three minutes. While, this mechanism may work to reduce bit error rate, reading every block in every flash memory die this often does not scale well with increasing amounts of storage memory. Also, reading every block increases read latency and operation contention for regular I/O operations since the reads of every block take up system bandwidth. The embodiments further described below are selective as to which blocks of 3D NAND flash memory to read.

Figure 9:
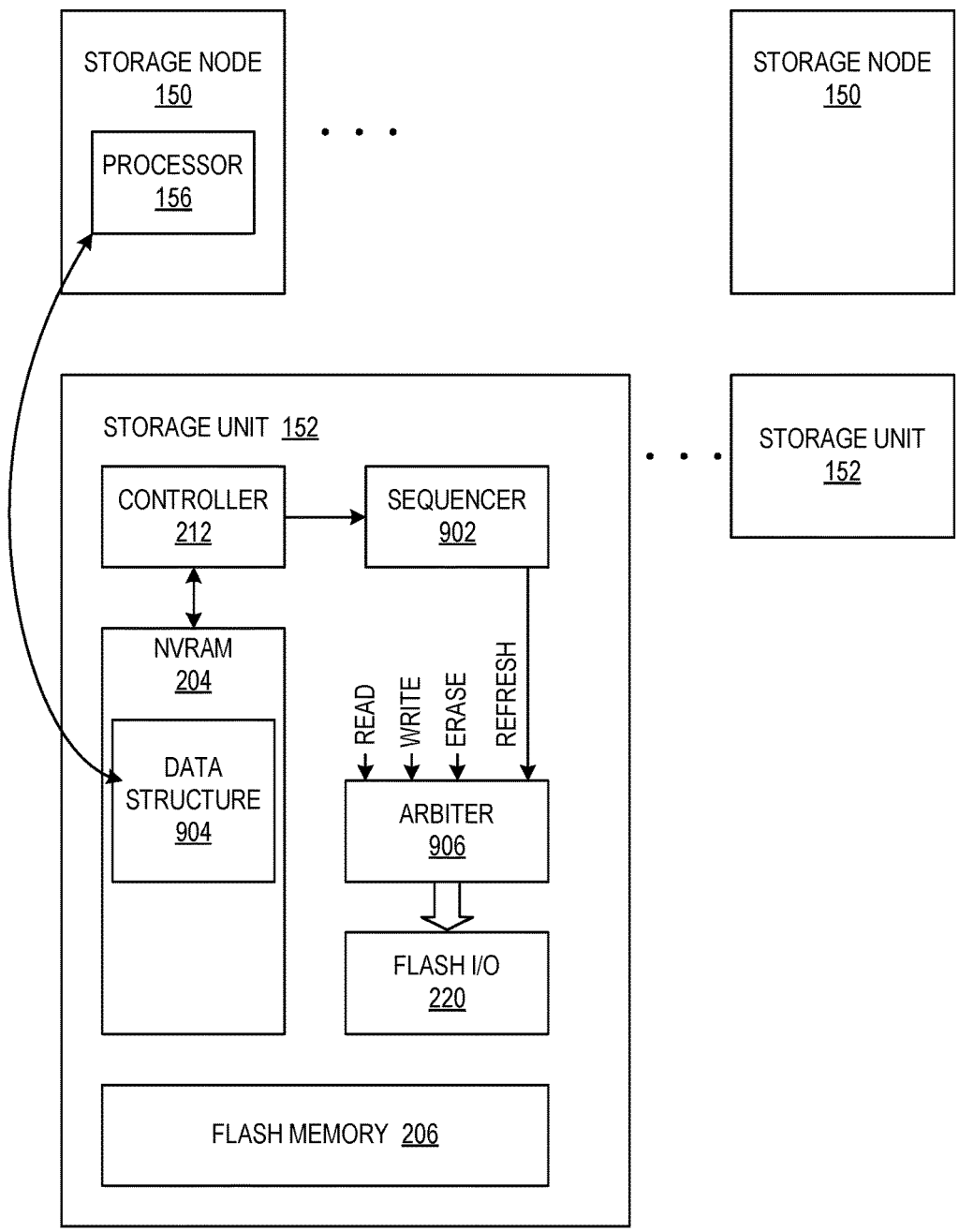
FIG. 9 is a block diagram of an embodiment of a solid-state storage that has a sequencer cycling through background read operations for flash memory blocks indicated by a data structure.

FIG. 9 is a block diagram of an embodiment of a solid-state storage that has a sequencer 902 cycling through background read operations for flash memory blocks indicated by a data structure 904. In this example, these features are shown in a storage cluster that includes multiple storage nodes 150 and multiple storage units 152 that have flash memory 206, but further embodiments are readily devised for other types of storage systems, such as storage arrays, solid-state drives, etc. The processor 156 of a storage node 150 determines which blocks should be refreshed, and writes information about these blocks, such as addresses, to a data structure 904 in NVRAM 204 of a storage unit 152. In a networked storage cluster as shown in FIGS. 1-9, various storage nodes 150 could communicate with various storage units 152, in setting up the blocks of flash memory 206 for refresh. Determination of which blocks to refresh is dynamic, and the data structure 904 can be updated on demand or in regular intervals as other blocks are identified for the refresh operation. In one embodiment, the data structure 904 includes a circular queue, so that older entries fall off or are overwritten as newer ones are added.

For example, a storage node 150 could receive a request for reading a file, and the authority 168 (see FIG. 2) for the Mode of the file could determine which blocks to refresh for low bit error rates while reading the file, and write information about those blocks to the data structure 904. In some embodiments, authorities 168 for ranges of data segments for the file could determine which blocks to refresh, and write, in parallel, information about those blocks to data structures 904 in various storage units 152. As another example of block selection, processors 156 in storage nodes 150 could determine which blocks of flash memory 206 have filesystem metadata, and write information about those blocks to data structures 904 and storage units 152. The system could recommend other portions of data or metadata in a similar manner, for refreshing of the blocks of flash memory.

In some embodiments, the list of blocks to be refreshed gets built across different blades 502 (see FIG. 5), e.g., by processors of storage nodes 150, and then transferred down to storage units 152 (e.g., to the storage unit hardware, such as the PLD 208 or an FPGA). Direct memory access, using the DMA unit 214, transfers contents of a list of blocks to the PLD 208 in each storage unit 152. Once in the PLD 208, the flash controller 212 in each storage unit 152 sources the relevant blocks to add to a refresh list specific to that storage unit 152.

Referring to FIGS. 2, 3, and 9, the controller 212 in the storage unit 152 then directs a sequencer 902 to sequence through background reads of the blocks according to the information in the data structure 904. In the embodiment shown, an arbiter 906 arbitrates among read operations, write operations, erase operations and possibly other foreground or background operations such as background maintenance operations, and the refresh background reads issued by the sequencer 902. For example, read and write operations could be given higher priority than erase operations and background refresh operations. The arbiter communicates with the flash I/O 220, which in turn communicates with the flash memory 206, as described above with reference to FIG. 3. Unlike user data reads, the data values that are read out for the background refresh operations can be disregarded and not transferred out of the storage unit 152 in some embodiments.

In the embodiment shown in FIG. 9, both the controller 212 of the storage unit 152, and the processor 156 of the storage node 150 can communicate directly with the NVRAM 204 in the storage unit 152. The sequencer 902 could be implemented as a hardware engine, in some embodiments, for example in a state machine in a field programmable gate array (FPGA) or programmable logic device (PLD). Also, in some embodiments, the sequencer 902 sequences the background reads in a cycle within a predetermined time interval, for example as determined by a timer or by the number of entries in the data structure 904. To set up the time interval, the processor 156 of a storage node 150 could communicate such a time interval to the controller 212 of the storage unit 152, which could then set up the sequencer 902 in accordance with that time interval in some embodiments.

Figure 10:
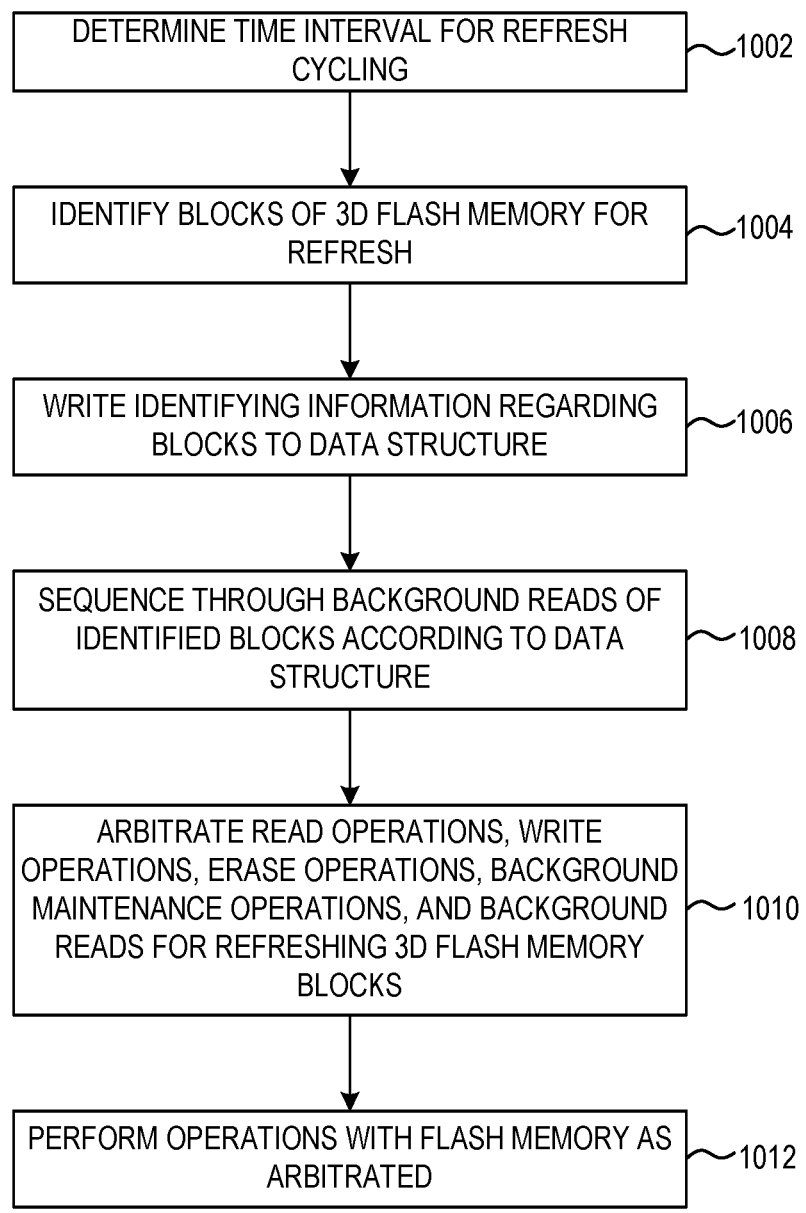
FIG. 10 is a flow diagram of a method for refreshing 3D NAND flash memory, which can be practiced in the storage cluster of FIGS. 1-9, or in storage arrays, solid-state storages or storage systems, in accordance with some embodiments.

FIG. 10 is a flow diagram of a method for refreshing 3D NAND flash memory, which can be practiced in the storage cluster of FIGS. 1-9, or in storage arrays, solid-state storages or storage systems, in accordance with some embodiments. The method can be practiced by one or more processors (e.g., executing software) and/or hardware engines, or firmware, or combinations thereof. In an action 1002, a time interval is determined for refresh cycling. The time interval could be based on manufacturer recommendations for 3D flash memory, laboratory testing, or empirically determined through system diagnostics, in some embodiments. In some embodiments the background reads may be based on a time based refresh responsive to a time based increase in raw bit error count that is tracked over time. Thus, in some embodiments the refresh cycle for the background reads may be adaptive based on this raw bit error count tracking. In an action 1004, blocks of 3D flash memory are identified for refresh. The system could identify blocks that will soon or ultimately be read for a file read based on a read request, or identify blocks that have filesystem metadata, etc. In an action 1006, identifying information regarding the blocks is written to a data structure. The information could include block identifiers, addresses, pointers, etc. In an action 1008, background reads of identified blocks are sequenced through, according to contents of the data structure. For example, a sequencer or other hardware engine, or firmware engine or software engine, could be programmed with the contents of the data structure or point to the data structure, and issue a sequence of background refresh read operations. In an action 1010, read operations, write operations, erase operations, background maintenance operations and background reads for refreshing 3D flash memory blocks are arbitrated. Arbitration could be single-channel, multichannel, hardwired or programmable based on rules, etc. The background reads of the identified blocks serve to discharge built-up static electric charges and reduce the raw bit errors from the 3D flash memory. In an action 1012, operations are performed with the flash memory, as arbitrated. It should be appreciated that a foreground task refers to a task that should be performed in sequence, in parallel or in line with any actions that are visible to a client, while a background task, such as a background refresh read, is one that can be performed immediately, or later, but which does not necessarily need to be performed prior to an action that is visible to a client (e.g., an acknowledgment, reply or other response to the client).

Figure 11:
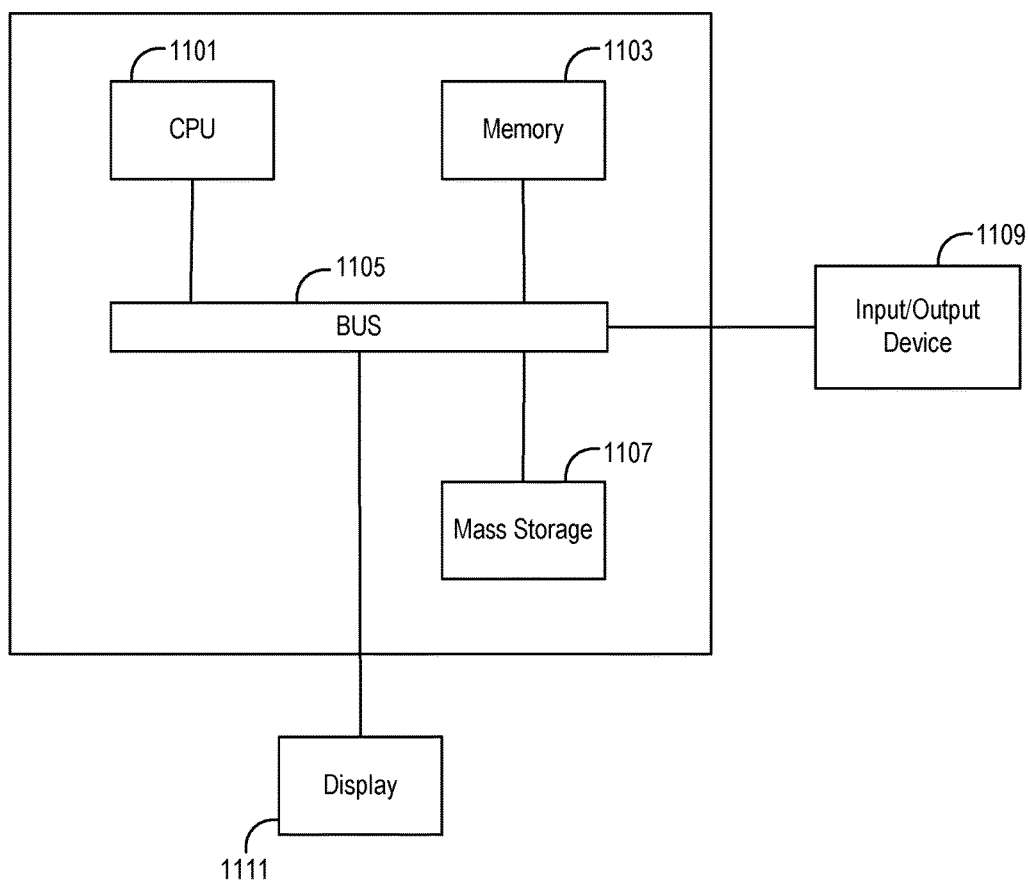
FIG. 11 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 11 is an illustration showing an exemplary computing device which may implement the embodiments described herein. The computing device of FIG. 11 may be used to perform embodiments of the functionality for the intelligent refresh of 3D NAND flash memory in accordance with some embodiments. The computing device includes a central processing unit (CPU) 1101, which is coupled through a bus 1105 to a memory 1103, and mass storage device 1107. Mass storage device 1107 represents a persistent data storage device such as a floppy disc drive or a fixed disc drive, which may be local or remote in some embodiments. Memory 1103 may include read only memory, random access memory, etc. Applications resident on the computing device may be stored on or accessed via a computer readable medium such as memory 1103 or mass storage device 1107 in some embodiments. Applications may also be in the form of modulated electronic signals modulated accessed via a network modem or other network interface of the computing device. It should be appreciated that CPU 1101 may be embodied in a general-purpose processor, a special purpose processor, or a specially programmed logic device in some embodiments.

Display 1111 is in communication with CPU 1101, memory 1103, and mass storage device 1107, through bus 1105. Display 1111 is configured to display any visualization tools or reports associated with the system described herein. Input/output device 1109 is coupled to bus 1105 in order to communicate information in command selections to CPU 1101. It should be appreciated that data to and from external devices may be communicated through the input/output device 1109. CPU 1101 can be defined to execute the functionality described herein to enable the functionality described with reference to FIGS. 1-10. The code embodying this functionality may be stored within memory 1103 or mass storage device 1107 for execution by a processor such as CPU 1101 in some embodiments. The operating system on the computing device may be MS DOS™, MS-WINDOWS™ OS/2™, UNIX™, LINUX™, or other known operating systems. It should be appreciated that the embodiments described herein may also be integrated with a virtualized computing system that is implemented with physical computing resources. It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is not intended to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A tangible, non-transitory, computer-readable media having instructions thereupon which, when executed by a processor, cause the processor to perform a method comprising:
   identifying a plurality of blocks of flash memory for a refresh operation;
   writing information regarding the identified blocks to a data structure accessible by a hardware engine that sequences background reads of the identified blocks as the refresh operation; and
   distributing the background reads to a plurality of channels communicating with the flash memory, wherein the plurality of channels has arbitration of read operations for user data, read operations for metadata, write operations for user data, write operations for metadata, background maintenance operations, erase operations, and the background reads.

2. The computer-readable media of claim 1, wherein the method further comprises:
   receiving a request to read a file; and
   determining portions of data belonging to the file, wherein the identifying the plurality of blocks comprises determining blocks of the flash memory that include the portions of data belonging to the file.

3. The computer-readable media of claim 1, wherein the identifying the plurality of blocks of the flash memory comprises identifying blocks of the flash memory that include filesystem metadata.

4. The computer-readable media of claim 1, wherein the method further comprises:
   communicating a time interval to a hardware engine that cycles the background reads according to the time interval, and wherein the background reads avoids any transfer of data from the identified blocks.

5. The computer-readable media of claim 1, wherein the method further comprises:

identifying further blocks of the flash memory for the refresh operation; and updating the data structure with information regarding the further blocks.

6. A storage system, comprising:

a flash memory;

one or more processors, configurable to identify blocks of the flash memory for a refresh operation and the one or more processors configurable to write information regarding the identified blocks;

a hardware engine, configurable to sequence background reads of the identified blocks according to the information as the refresh operation;

an arbiter, configurable to arbitrate read operations for user data or metadata, write operations for user data or metadata, background maintenance operations, erase operations, and the background reads, for a plurality of channels; and a further memory configurable to hold a data structure, wherein the one or more processors are configurable to write the information regarding the identified blocks to the data structure.

7. The storage system of claim 6, wherein the one or more processors is configurable to determine which blocks of the flash memory have portions of data that belong to a file, responsive to receiving a request to read the file.

8. The storage system of claim 6, wherein the one or more processors are configurable to determine which blocks of the flash memory have filesystem metadata.

9. The storage system of claim 6, wherein the hardware engine is configurable to sequence the background reads in a cycle within a predetermined time interval, and wherein the background reads disregard read data values.

10. The storage system of claim 6, further comprising:

a plurality of hardware engines, distributed throughout the storage system; and a plurality of data structures, distributed throughout the storage system, each one of the plurality of data structures associated with one of the hardware engines.

11. The storage system of claim 6, further comprising:

the one or more processors further configurable to identify further blocks of the flash memory for the refresh operation and configurable to update the data structure regarding the further blocks and wherein the flash memory is three dimensional (3D) flash memory.

* * * * *